United States Patent [19]

Yanagisawa et al.

[11] Patent Number: 5,300,792
[45] Date of Patent: Apr. 5, 1994

[54] GAP RED LIGHT EMITTING DIODE

[75] Inventors: Munehisa Yanagisawa, Takasaki; Susumu Arisaka; Yuki Tamura, both of Annaka; Toshio Otaki, Takasaki, all of Japan

[73] Assignee: Shin-Etsu Handotai Co., Ltd., Tokyo, Japan

[21] Appl. No.: 960,330

[22] Filed: Oct. 13, 1992

[30] Foreign Application Priority Data

Oct. 15, 1991 [JP] Japan .................................. 3-294998

[51] Int. Cl.$^5$ ............................................ H01L 33/00
[52] U.S. Cl. ..................................... 257/101; 257/87; 257/102
[58] Field of Search ................... 257/87, 89, 101, 102, 257/103

[56] References Cited

U.S. PATENT DOCUMENTS

| | | | |
|---|---|---|---|
| 4,001,056 | 1/1977 | Groves et al. | 257/87 |
| 4,017,800 | 4/1977 | Kasami et al. | 257/102 |
| 4,224,632 | 9/1980 | Iwamoto et al. | 257/101 |

FOREIGN PATENT DOCUMENTS

| | | | |
|---|---|---|---|
| 54-130888 | 10/1979 | Japan | 257/89 |
| 59-18686 | 1/1984 | Japan | 257/101 |
| 59-165476 | 9/1984 | Japan | 257/101 |
| 2006043 | 5/1979 | United Kingdom | 257/102 |

OTHER PUBLICATIONS

Journal of the Electrochemical Society, vol. 124, No. 8, Aug. 1977, Manchester, New Hampshire, pp. 1285-1289, Tatsuhiko Niina "GaP Red Light Emitting Diodes Produced by a Rotating Boat System of Liquid Phase Epitaxial Growth".

Journal of the Electrochemical Society, vol. 122, No. 9, Sep. 1975, Manchester, New Hampshire, pp. 1230-1233, O. G. Lorimor et al, "Observations on Si Contamination in GaP LPE".

Patent Abstracts of Japan, vol. 8, No. 103 (E-244) May 15, 1984 & JP-A-59 18 686 (Ssnyo Denki KK) Jan. 31, 1984, Kentarou.

Revue De Physique Applilquee, vol. 13, No. 12, Dec. 1978, Paris FR pp. 741-744, J. Pfeifer "Observations on Residual Donors in GaP LPE".

*Primary Examiner*—Rolf Hille
*Assistant Examiner*—Ninhloan Tran
*Attorney, Agent, or Firm*—Nikaido, Marmelstein, Murray & Oram

[57] ABSTRACT

A GaP red light emitting diode (LED) which is free from a problem of luminance reduction comprises an n-type GaP epitaxial layer grown on an n-type GaP substrate, and a p-type GaP epitaxial layer grown on the n-type Gap epitaxial layer, wherein the n-type epitaxial layer has an Si concentration of not more than $5 \times 10^{17}$ atoms/cc and an S concentration of not more than $1 \times 10^{18}$ atoms/cc.

4 Claims, 2 Drawing Sheets

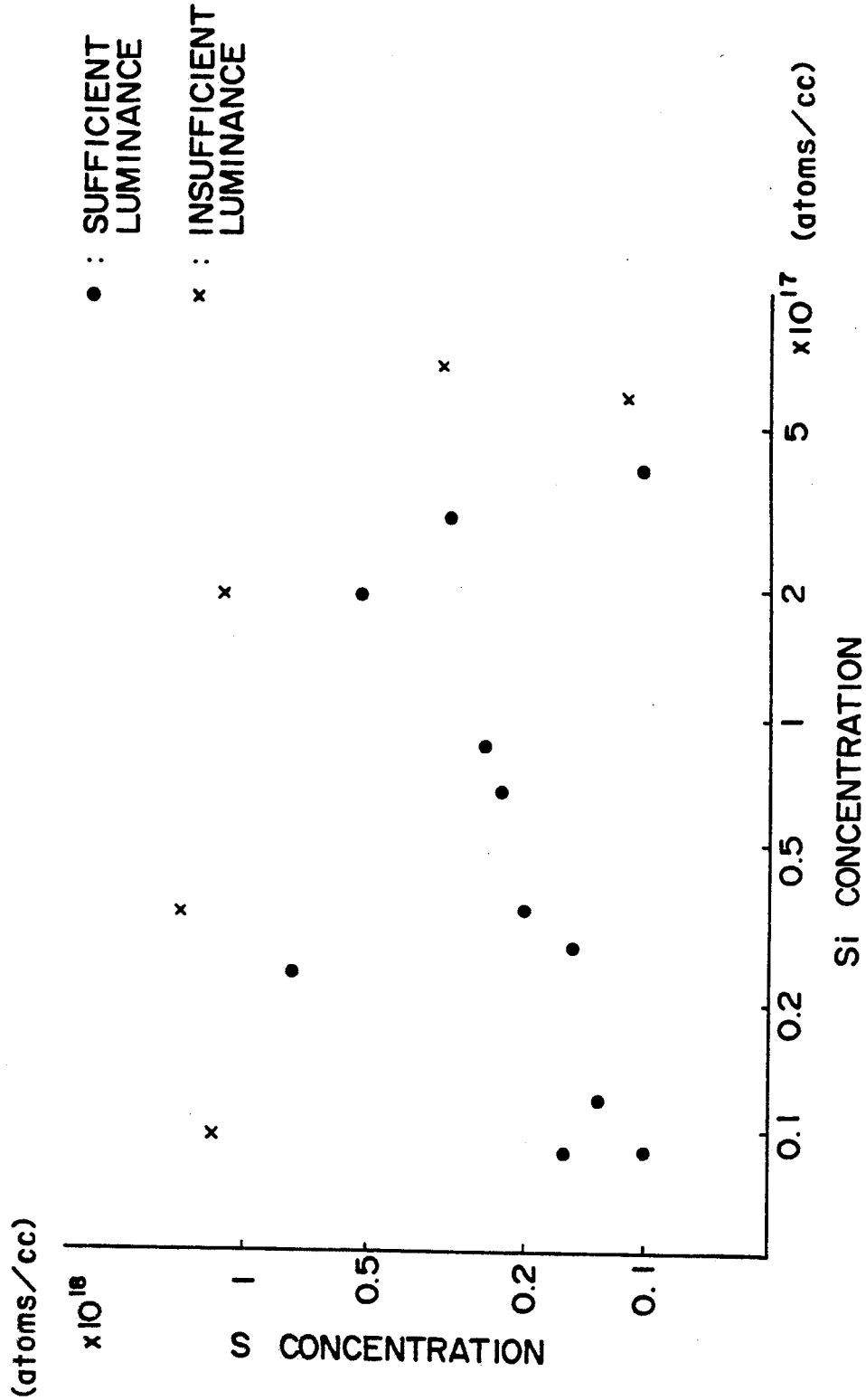

GAP RED LIGHT EMITTING DIODE

BACKGROUND OF THE INVENTION

1. Field of the Invention

The present invention relates to a GaP red light emitting diode (LED) having a high luminance level.

2. Description of the Prior Art

Heretofore, GaP red LEDs have generally been fabricated by the liquid-phase epitaxial growth method. In this epitaxial growth method, an n-type GaP epitaxial layer doped with Te is grown on an n-type GaP substrate. Subsequently, from a Ga melt added with Zn and $Ga_2O_3$, a p-type GaP epitaxial layer is grown and deposited on the n-type GaP epitaxial layer, thus making a p-n junction. The resulting crystal is annealed at about 500° C. with the result that Zn-O pairs are created. The Zn-O pairs form an emission center from which red light is emitted.

The GaP LEDs of the type described often cause a problem of luminance reduction or drop and, hence, a satisfactory solution of this problem has been desired. However, there have been considerable difficulties in clearing up factors having direct connection with the luminance reduction.

Through a lengthy and careful investigation on the cause of the luminance reduction of the GaP red LEDs, the present inventors uncovered the fact that the luminance reduction is closely related to the impurity concentration of the n-type epitaxial layer, more particularly to the Si concentration and S concentration. Based on this finding, the present invention was made.

SUMMARY OF THE INVENTION

It is an object of this invention to provide a GaP red LED which is free from a problem of luminance reduction.

To attain the foregoing object, the present invention provides a GaP red LED comprising: an n-type GaP epitaxial layer grown on an n-type GaP substrate; and a p-type GaP epitaxial layer grown on the n-type Gap epitaxial layer, wherein the n-type epitaxial layer has an Si concentration of not more than $5 \times 10^{17}$ atoms/cc and an S concentration of not more than $1 \times 10^{18}$ atoms/cc.

The Si concentration when exceeding $5 \times 10^{17}$ atoms/cc brings about a problem of luminance reduction of the GaP red LED and is, therefore, unable to attain the underlying object of the present invention.

The S concentration when exceeding $1 \times 10^{18}$ atoms/cc also causes the luminance reduction problem in the GaP red LED and is, therefore, unable to attain the underlying object of the present invention.

The Si concentration and S concentration when approaching the respective upper limits specified above, the luminance reduction problem may occur due to synergistic effect of Si and S.

Many other objects, advantages and features of the present invention will be better understood from the following description taken in conjunction with the accompanying drawings.

BRIEF DESCRIPTION OF THE DRAWINGS

FIG. 2 is a graph showing a correlation between the luminance of GaP red LEDs and the concentrations of S and Si in the n-type epitaxial layers of the respective GaP red LEDs according to inventive examples and comparative examples.

DETAILED DESCRIPTION OF THE INVENTION

Figure 1:
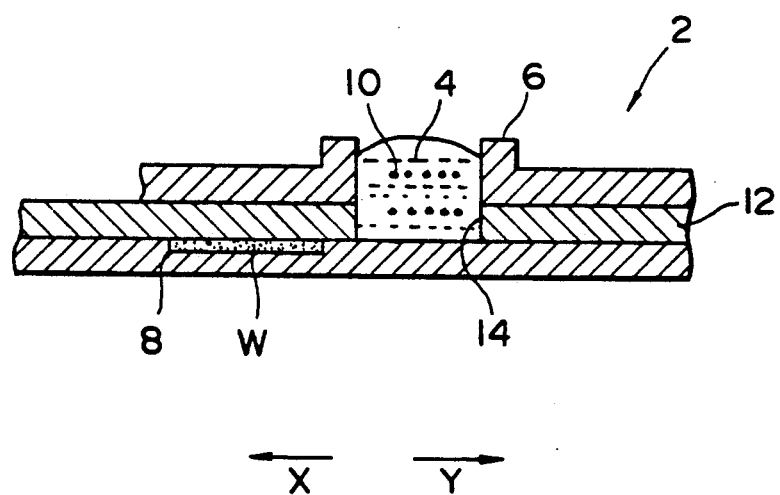
FIG. 1 is a schematic cross-sectional view of a portion of a slide boat used in Example 1, described later, of the present invention.

The invention will be further described by way of the following examples which should be construed as illustrative rather than restrictive.

FIG. 1 shows a slide boat used to carry out the liquid-phase growth process of the invention. In FIG. 1, reference character 2 is a slide boat, 4 is a Ga melt, 6 is a receptacle holding therein the Ga melt 4, W is a single crystal substrate, 8 is a recess formed in a lower plate (not designated) of the slide boat 2, 10 is a GaP polycrystal, 12 is an intermediate slide plate, and 14 is a cavity in the intermediate slide plate 12.

EXAMPLE 1

Using the slide boat 2 shown in FIG. 1, an n-type GaP epitaxial layer was grown on the substrate W in the sequence of processes (1)–(6) described below.

(1) Insert the slide boat 2 into a reaction furnace with a Ga melt 4 held in the receptacle 6 and a single crystal substrate W held in the recess 8 of the slide boat 2. To the Ga melt 4 were added a GaP polycrystal 10 and GaTe.

(2) While supplying an $H_2$ 100% gas into the reaction furnace, heat the reaction furnace up to 1000° C. and thereafter maintain the reaction furnace at the same temperature for 90 minutes, thereby causing the GaP polycrystal to melt down into the Ga melt or solution 4.

(3) Move the intermediate slide plate 12 in the direction of the arrow X until the cavity 14 is in registry with the single crystal substrate W, so that the Ga melt 4 is brought into contact with the single crystal substrate W.

(4) Heat the reaction furnace up to 1010° C. and hold the reaction furnace at this temperature for 30 minutes, thereby causing a portion of the single crystal substrate W to melt back into the Ga melt 4.

(5) Cool down the reaction furnace at the rate of 1°–3° C. per minute, thereby commencing a liquid phase growth of an n-type GaP epitaxial layer.

(6) When the reaction furnace is cooled down to 700° C., move the intermediate slide plate 12 in the direction of the arrow Y, thereby terminating the liquid-phase growth.

The n-type GaP epitaxial layer thus grown was measured for concentrations of S and Si by SIMS (secondary ion mass spectroscopy). Results of measurement indicated that $S = 2.1 \times 10^{17}$ atoms/cc and $Si = 6.5 \times 10^{16}$ atoms/cc.

Thereafter, using a slide board having the same construction as the slide board 2 shown in FIG. 1, a p-type GaP epitaxial layer was grown on the above-mentioned n-type GaP epitaxial layer in the sequence of processes (1)–(6) described below, so as to fabricate a GaP red-light light-emitting device.

(1) Insert the slide boat 2 into a reaction furnace with a Ga melt 4 held in the receptacle 6 and a single crystal substrate W held in the recess 8 of the slide boat 2. To the Ga melt 4 were added a GaP polycrystal 10, Zn and $Ga_2O_3$.

(2) While supplying an Ar gas into the reaction furnace, heat the reaction furnace up to 1000° C. and thereafter maintain the reaction furnace at the same temperature for 30 minutes, thereby causing the GaP polycrystal, Zn and Ga$_2$O$_3$ to melt down into the Ga melt 4.

(3) Move the intermediate slide plate 12 in the direction of the arrow X until the cavity 14 is in registry with the single crystal substrate W, so that the Ga melt 4 is brought into contact with the single crystal substrate W.

(4) Heat the reaction furnace up to 1010° C. and hold the reaction furnace at this temperature for 30 minutes, thereby causing a portion of the single crystal substrate W to melt back into the Ga melt 4.

(5) Cool down the reaction furnace at the rate of 3°-5° C. per minute, thereby commencing a liquid phase growth of an epitaxial layer.

(6) When the reaction furnace is cooled down to 800° C., move the intermediate slide plate 12 in the direction of the arrow Y, thereby terminating the liquid-phase growth.

An epitaxial wafer thus obtained was annealed in an Ar atmosphere at 500° C. for 20 hours, thereby forming Zn and O pairs that emit red light.

Then, the epitaxial wafer was cut into 0.3 mm-square chips, and using a header (TO-18 header), the luminance of the chips was measured. Results of the measurement indicated that the epitaxial wafer chips (GaP red LEDs) had an excellent relative luminance such as equal to 1.00.

COMPARATIVE EXAMPLE 1

An n-type GaP epitaxial layer was produced by repeating the procedure of Example 1 except that GaTe and S were added as n-type dopants.

The n-type GaP epitaxial layer thus grown was measured for concentrations of S and Si by SIMS. Results of this measurement indicated that S=1.4×10$^{18}$ atoms/cc and Si=3.5×10$^{16}$ atoms/cc.

On the n-type GaP epitaxial layer was grown a p-type GaP epitaxial layer in the same manner as done in Example 1. The resulting epitaxial wafer was annealed at 500° C. for 20 hours and, subsequently, cut into 0.3 mm-square chips. A luminance measurement made in the same manner as Example 1 indicated that the epitaxial wafer chips (GaP red LEDs) of Comparative Example 1 had a low relative luminance such as equal to 0.87.

COMPARATIVE EXAMPLE 2

An n-type GaP epitaxial layer was produced by repeating the procedure of Example 1 except that GaTe and Si were added as n-type dopants.

The n-type GaP epitaxial layer thus grown was measured for concentrations of S and Si by SIMS. Results of this measurement indicated that S=3.2×10$^{17}$ atoms/cc and Si=7.0×10$^{17}$ atoms/cc.

On the n-type GaP epitaxial layer, a p-type GaP epitaxial layer was in the same manner as done in Example 1. The resulting epitaxial wafer was annealed at 500° C. for 20 hours and, subsequently, cut into 0.3 mm-square chips. The chips were measured for relative luminance. Results of this measurement indicated that the epitaxial wafer chips (GaP red LEDs) of Comparative Example 2 had a low relative luminance such as equal to 0.91.

Similar experiments were repeated in order to determine a correlation between the luminance and the concentrations of S and Si. Using a criterion of relative luminance=0.95, the epitaxial wafer chips (GaP red LEDs) were classified into two groups depending on their luminance levels, i.e., non-defective epitaxial wafer chips having relative luminance levels not less than 0.95, and defective epitaxial wafer chips having relative luminance levels less than 0.95. Results thus obtained are shown in FIG. 2. In FIG. 2, the mark "o" represents an epitaxial wafer chip (GaP red LEDs) having a relative luminance of 0.95 or more (sufficient luminance), and the mark "x" represents an epitaxial wafer chip (GaP red LEDs) having a relative luminance less than 0.95 (insufficient luminance).

It can be understood from FIG. 2 that the GaP red LED having a sufficient luminance and, hence, free from a luminance reduction problem has a specified range of impurity concentration in its n-type epitaxial layer, that is, an Si concentration of not more than 5×10$^{17}$ atoms/cc and an S concentration of not more than 1×10$^{18}$ atoms/cc.

As described above, a GaP red LED of this invention is able to emit red light without involving a luminance reduction problem.

What is claimed is:

1. In a GaP red light emitting diode comprising:
   an n-type GaP epitaxial layer doped with Te grown on an n-type GaP substrate; and
   a p-type GaP epitaxial layer containing red light emitting zn-O pairs grown on said n-type GaP epitaxial layer,
   the improvement, whereby said diode has a luminance of at least 0.95, which comprises limiting the silicon concentration of said n-type layer to a red light emitting enhancing amount of not more than 5×10$^{17}$ atoms/cc and limiting the sulfur concentration of said n-type layer to a red light emitting enhancing amount of not more than 1×10$^{18}$ atoms/cc.

2. In the method of emitting light, including red light, from a light emitting diode, which diode comprises:
   an n-type GaP epitaxial layer grown on an n-type GaP substrate; and
   a p-type GaP epitaxial layer grown on said n-type epitaxial layer;
   wherein said method comprises energizing said diode to an extent sufficient to cause said light to be emitted thereby;
   the improvement, whereby enhancing the red light emitted by said diode, which comprises:
   forming said diode while limiting:
     the silicon concentration in said n-type epitaxial layer to a red light emission enhancing amount, which is not more than 5×10$^{17}$ atoms per cc, and
     the sulfur concentration in said n-type epitaxial layer to a red light emission enhancing amount, which is not more than 1×10$^{18}$ atoms per cc, and
   then energizing said diode to an extent sufficient to produce light, with a luminance of at least 0.95 and with enhanced red light, therefrom.

3. The improved method as claimed in claim 2 including providing a red light emitting amount of Te in said n-type epitaxial layer.

4. The improved method as claimed in claim 2 including providing a red light emitting amount of zinc-oxygen pairs in said p-type epitaxial layer.

* * * * *